(12) United States Patent
Bencuya et al.

(10) Patent No.: US 7,745,289 B2
(45) Date of Patent: Jun. 29, 2010

(54) METHOD OF FORMING A FET HAVING ULTRA-LOW ON-RESISTANCE AND LOW GATE CHARGE

(75) Inventors: Izak Bencuya, Saratoga, CA (US);
Brian Sze-Ki Mo, Palo Alto, CA (US);
Ashok Challa, Sandy, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 889 days.

(21) Appl. No.: 10/997,818

(22) Filed: Nov. 24, 2004

(65) Prior Publication Data
US 2005/0153497 A1 Jul. 14, 2005

Related U.S. Application Data

(60) Continuation-in-part of application No. 10/754,276, filed on Jan. 8, 2004, now abandoned, which is a division of application No. 09/640,955, filed on Aug. 16, 2000, now Pat. No. 6,696,726.

(51) Int. Cl.
*H01L 21/336* (2006.01)

(52) U.S. Cl. ................... 438/270; 438/156; 438/212; 438/268; 438/269; 438/272; 257/328; 257/329; 257/330; 257/331; 257/334

(58) Field of Classification Search ................ 438/156, 438/212, 268, 269, 270, 272, FOR. 192, FOR. 176; 257/328, 329, 330, 331, 334
See application file for complete search history.

(56) References Cited

U.S. PATENT DOCUMENTS 3,404,295 A 10/1968 Warner et al.

(Continued)

FOREIGN PATENT DOCUMENTS

CN 1036666 A 10/1989

(Continued)

OTHER PUBLICATIONS

Bai at al., "Novel automated optimization of power MOSFET for 12V input, high-frequency DC-DC converter," *International Symposium on Power Semiconductors and ICs, Technical Digest*, (2003), pp. 366-369.

(Continued)

*Primary Examiner*—N Drew Richards
*Assistant Examiner*—Joannie A Garcia
(74) *Attorney, Agent, or Firm*—Townsend and Townsend and Crew LLP

(57) ABSTRACT

In accordance with an exemplary embodiment of the invention, a substrate of a first conductivity type silicon is provided. A substrate cap region of the first conductivity type silicon is formed such that a junction is formed between the substrate cap region and the substrate. A body region of a second conductivity type silicon is formed such that a junction is formed between the body region and the substrate cap region. A trench extending through at least the body region is then formed. A source region of the first conductivity type is then formed in an upper portion of the body region. An out-diffusion region of the first conductivity type is formed in a lower portion of the body region as a result of one or more temperature cycles such that a spacing between the source region and the out-diffusion region defines a channel length of the field effect transistor.

13 Claims, 9 Drawing Sheets

U.S. PATENT DOCUMENTS

| | | | |
|---|---|---|---|
| 3,412,297 A | 11/1968 | Amlinger | |
| 3,497,777 A | 2/1970 | Teszner et al. | |
| 3,564,356 A | 2/1971 | Wilson | |
| 3,660,697 A | 5/1972 | Berglund et al. | |
| 4,003,072 A | 1/1977 | Matsushita et al. | |
| 4,300,150 A | 11/1981 | Colak | |
| 4,326,332 A | 4/1982 | Kenney et al. | |
| 4,337,474 A | 6/1982 | Yukimoto | |
| 4,345,265 A | 8/1982 | Blanchard | |
| 4,445,202 A * | 4/1984 | Goetze et al. | |
| 4,546,367 A * | 10/1985 | Schutten et al. | 257/331 |
| 4,579,621 A | 4/1986 | Hine | |
| 4,636,281 A | 1/1987 | Buiguez et al. | |
| 4,638,344 A | 1/1987 | Cardwell, Jr. | |
| 4,639,761 A | 1/1987 | Singer et al. | |
| 4,698,653 A | 10/1987 | Cardwell, Jr. | |
| 4,716,126 A | 12/1987 | Cogan | |
| 4,746,630 A | 5/1988 | Hui et al. | |
| 4,754,310 A | 6/1988 | Coe | |
| 4,774,556 A | 9/1988 | Fujii et al. | |
| 4,801,986 A | 1/1989 | Chang et al. | |
| 4,821,095 A | 4/1989 | Temple | |
| 4,823,176 A | 4/1989 | Baliga et al. | |
| 4,853,345 A | 8/1989 | Himelick | |
| 4,868,624 A | 9/1989 | Grung et al. | |
| 4,893,160 A | 1/1990 | Blanchard | |
| 4,914,058 A | 4/1990 | Blanchard | |
| 4,941,026 A | 7/1990 | Temple | |
| 4,967,245 A | 10/1990 | Cogan et al. | |
| 4,974,059 A | 11/1990 | Kinzer | |
| 4,990,463 A | 2/1991 | Mori | |
| 4,992,390 A | 2/1991 | Chang | |
| 5,027,180 A | 6/1991 | Nishizawa et al. | |
| 5,034,785 A | 7/1991 | Blanchard | |
| 5,071,782 A | 12/1991 | Mori | |
| 5,072,266 A | 12/1991 | Bulucea | |
| 5,079,608 A | 1/1992 | Wodarczyk et al. | |
| 5,105,243 A | 4/1992 | Nakagawa et al. | |
| 5,111,253 A | 5/1992 | Korman et al. | |
| 5,142,640 A | 8/1992 | Iwanatsu | |
| 5,164,325 A | 11/1992 | Cogan et al. | |
| 5,164,802 A | 11/1992 | Jones et al. | |
| 5,216,275 A | 6/1993 | Chen | |
| 5,219,777 A | 6/1993 | Kang | |
| 5,219,793 A | 6/1993 | Cooper et al. | |
| 5,233,215 A | 8/1993 | Baliga | |
| 5,262,336 A | 11/1993 | Pike, Jr. et al. | |
| 5,268,311 A | 12/1993 | Euen et al. | |
| 5,275,965 A | 1/1994 | Manning | |
| 5,294,824 A | 3/1994 | Okada | |
| 5,298,781 A | 3/1994 | Cogan et al. | |
| 5,300,447 A | 4/1994 | Anderson | |
| 5,326,711 A | 7/1994 | Malhi | |
| 5,350,937 A | 9/1994 | Yamazaki et al. | |
| 5,365,102 A | 11/1994 | Mehrotra et al. | |
| 5,366,914 A | 11/1994 | Takahashi et al. | |
| 5,389,815 A | 2/1995 | Takahashi | |
| 5,405,794 A | 4/1995 | Kim | |
| 5,410,170 A * | 4/1995 | Bulucea et al. | 257/332 |
| 5,418,376 A | 5/1995 | Muraoka et al. | |
| 5,424,231 A | 6/1995 | Yang | |
| 5,429,977 A | 7/1995 | Lu et al. | |
| 5,430,311 A | 7/1995 | Murakami et al. | |
| 5,430,324 A | 7/1995 | Bencuya | |
| 5,434,435 A | 7/1995 | Baliga | |
| 5,436,189 A | 7/1995 | Beasom | |
| 5,438,215 A | 8/1995 | Tihanyi | |
| 5,442,214 A | 8/1995 | Yang | |
| 5,473,176 A | 12/1995 | Kakumoto | |
| 5,473,180 A | 12/1995 | Ludikhuize | |
| 5,474,943 A | 12/1995 | Hshieh et al. | |
| 5,486,772 A * | 1/1996 | Hshieh et al. | 324/769 |
| 5,519,245 A | 5/1996 | Tokura et al. | |
| 5,541,425 A | 7/1996 | Nishihara | |
| 5,554,862 A | 9/1996 | Omura et al. | |
| 5,567,634 A | 10/1996 | Hebert et al. | |
| 5,567,635 A | 10/1996 | Acovic et al. | |
| 5,572,048 A | 11/1996 | Sugawara | |
| 5,576,245 A | 11/1996 | Cogan et al. | |
| 5,578,851 A | 11/1996 | Hshieh et al. | |
| 5,581,100 A | 12/1996 | Ajit | |
| 5,583,065 A | 12/1996 | Miwa | |
| 5,592,005 A | 1/1997 | Floyd et al. | |
| 5,595,927 A | 1/1997 | Chen et al. | |
| 5,597,765 A | 1/1997 | Yilmaz et al. | |
| 5,605,852 A | 2/1997 | Bencuya | |
| 5,616,945 A | 4/1997 | Williams | |
| 5,623,152 A | 4/1997 | Majumdar et al. | |
| 5,629,543 A | 5/1997 | Hshieh et al. | |
| 5,637,898 A | 6/1997 | Baliga | |
| 5,639,676 A | 6/1997 | Hshieh et al. | |
| 5,640,034 A | 6/1997 | Malhi | |
| 5,648,670 A | 7/1997 | Blanchard | |
| 5,656,843 A | 8/1997 | Goodyear et al. | |
| 5,665,619 A | 9/1997 | Kwan et al. | |
| 5,670,803 A | 9/1997 | Beilstein, Jr. et al. | |
| 5,689,128 A | 11/1997 | Hshieh et al. | |
| 5,693,569 A | 12/1997 | Ueno | |
| 5,705,409 A | 1/1998 | Witek | |
| 5,710,072 A | 1/1998 | Krautschneider et al. | |
| 5,714,781 A | 2/1998 | Yamamoto et al. | |
| 5,719,409 A | 2/1998 | Singh et al. | |
| 5,770,878 A | 6/1998 | Beasom | |
| 5,776,813 A | 7/1998 | Huang et al. | |
| 5,780,343 A | 7/1998 | Bashir | |
| 5,801,417 A | 9/1998 | Tsang et al. | |
| 5,814,858 A | 9/1998 | Williams | |
| 5,877,528 A | 3/1999 | So | |
| 5,879,971 A | 3/1999 | Witek | |
| 5,879,994 A | 3/1999 | Kwan et al. | |
| 5,895,951 A | 4/1999 | So et al. | |
| 5,895,952 A | 4/1999 | Darwish et al. | |
| 5,897,343 A | 4/1999 | Mathew et al. | |
| 5,897,360 A | 4/1999 | Kawaguchi | |
| 5,900,663 A | 5/1999 | Johnson et al. | |
| 5,906,680 A | 5/1999 | Meyerson | |
| 5,917,216 A | 6/1999 | Floyd et al. | |
| 5,929,481 A | 7/1999 | Hshieh et al. | |
| 5,943,581 A | 8/1999 | Lu et al. | |
| 5,949,104 A | 9/1999 | D'Anna et al. | |
| 5,949,124 A | 9/1999 | Hadizad et al. | |
| 5,959,324 A | 9/1999 | Kohyama | |
| 5,960,271 A | 9/1999 | Wollesen et al. | |
| 5,972,741 A | 10/1999 | Kubo et al. | |
| 5,973,360 A | 10/1999 | Tihanyi | |
| 5,973,367 A | 10/1999 | Williams | |
| 5,976,936 A | 11/1999 | Miyajima et al. | |
| 5,981,344 A | 11/1999 | Hshieh et al. | |
| 5,981,996 A | 11/1999 | Fujishima | |
| 5,998,833 A | 12/1999 | Baliga | |
| 6,005,271 A | 12/1999 | Hshieh | |
| 6,008,097 A | 12/1999 | Yoon et al. | |
| 6,011,298 A | 1/2000 | Blanchard | |
| 6,015,727 A | 1/2000 | Wanlass | |
| 6,020,250 A | 2/2000 | Kenney et al. | |
| 6,034,415 A | 3/2000 | Johnson et al. | |
| 6,037,202 A | 3/2000 | Witek | |
| 6,037,628 A | 3/2000 | Huang | |
| 6,037,632 A | 3/2000 | Omura et al. | |
| 6,040,600 A | 3/2000 | Uenishi et al. | |
| 6,048,772 A | 4/2000 | D'Anna | |
| 6,049,108 A | 4/2000 | Williams et al. | |
| 6,057,558 A | 5/2000 | Yamamoto et al. | |
| 6,063,678 A | 5/2000 | D'Anna | |

| | | | | | | |
|---|---|---|---|---|---|---|
| 6,064,088 | A | 5/2000 | D'Anna | 6,376,878 B1 | 4/2002 | Kocon |
| 6,066,878 | A | 5/2000 | Neilson | 6,376,890 B1 | 4/2002 | Tihanyi |
| 6,069,043 | A | 5/2000 | Floyd et al. | 6,384,456 B1 | 5/2002 | Tihanyi |
| 6,081,009 | A | 6/2000 | Neilson | 6,388,286 B1 | 5/2002 | Baliga |
| 6,084,264 | A | 7/2000 | Darwish | 6,388,287 B2 | 5/2002 | Deboy et al. |
| 6,084,268 | A | 7/2000 | de Frésart et al. | 6,400,003 B1 | 6/2002 | Huang |
| 6,087,232 | A | 7/2000 | Kim et al. | 6,429,481 B1 | 8/2002 | Mo et al. |
| 6,096,608 | A | 8/2000 | Williams | 6,433,385 B1 | 8/2002 | Kocon et al. |
| 6,097,063 | A | 8/2000 | Fujihira | 6,436,779 B2 | 8/2002 | Hurkx et al. |
| 6,103,578 | A | 8/2000 | Uenishi et al. | 6,437,399 B1 | 8/2002 | Huang |
| 6,104,054 | A | 8/2000 | Corsi et al. | 6,441,454 B2 | 8/2002 | Hijzen et al. |
| 6,110,799 | A | 8/2000 | Huang | 6,452,230 B1 | 9/2002 | Boden, Jr. |
| 6,114,727 | A | 9/2000 | Ogura et al. | 6,461,918 B1 | 10/2002 | Calafut |
| 6,137,152 | A | 10/2000 | Wu | 6,465,304 B1 | 10/2002 | Blanchard et al. |
| 6,150,697 | A | 11/2000 | Teshigahara et al. | 6,465,843 B1 | 10/2002 | Hirler et al. |
| 6,156,606 | A | 12/2000 | Michaelis | 6,465,869 B2 | 10/2002 | Ahlers et al. |
| 6,156,611 | A | 12/2000 | Lan et al. | 6,472,678 B1 | 10/2002 | Hshieh et al. |
| 6,163,052 | A | 12/2000 | Liu et al. | 6,472,708 B1 | 10/2002 | Hshieh et al. |
| 6,165,870 | A | 12/2000 | Shim et al. | 6,475,884 B2 | 11/2002 | Hshieh et al. |
| 6,168,983 | B1 | 1/2001 | Rumennik et al. | 6,476,443 B1 | 11/2002 | Kinzer |
| 6,168,996 | B1 | 1/2001 | Numazawa et al. | 6,479,352 B2 | 11/2002 | Blanchard |
| 6,171,935 | B1 | 1/2001 | Nance et al. | 6,489,652 B1 | 12/2002 | Jeon et al. |
| 6,174,773 | B1 | 1/2001 | Fujishima | 6,501,146 B1 | 12/2002 | Harada |
| 6,174,785 | B1 | 1/2001 | Parekh et al. | 6,580,123 B2 | 6/2003 | Thapar |
| 6,184,545 | B1 | 2/2001 | Werner et al. | 6,608,350 B2 | 8/2003 | Kinzer et al. |
| 6,184,555 | B1 | 2/2001 | Tihanyi et al. | 2001/0023961 A1 | 9/2001 | Hsieh et al. |
| 6,188,104 | B1 | 2/2001 | Choi et al. | 2001/0028083 A1 | 10/2001 | Onishi et al. |
| 6,188,105 | B1 | 2/2001 | Kocon et al. | 2001/0032998 A1 | 10/2001 | Iwamoto et al. |
| 6,190,978 | B1 | 2/2001 | D'Anna | 2001/0041400 A1 | 11/2001 | Ren et al. |
| 6,191,447 | B1 | 2/2001 | Baliga | 2001/0049167 A1 | 12/2001 | Madson |
| 6,194,741 | B1 | 2/2001 | Kinzer et al. | 2001/0050394 A1 | 12/2001 | Onishi et al. |
| 6,198,127 | B1 | 3/2001 | Kocon | 2002/0009832 A1 | 1/2002 | Blanchard |
| 6,201,278 | B1 | 3/2001 | Gardner et al. | 2002/0014658 A1 | 2/2002 | Blanchard |
| 6,201,279 | B1 | 3/2001 | Pfirsch | 2002/0066924 A1 | 6/2002 | Blanchard |
| 6,204,097 | B1 | 3/2001 | Shen et al. | 2002/0070418 A1 | 6/2002 | Kinzer et al. |
| 6,207,994 | B1 | 3/2001 | Rumennik et al. | 2002/0100933 A1 | 8/2002 | Marchant |
| 6,222,233 | B1 | 4/2001 | D'Anna | 2003/0060013 A1 | 3/2003 | Marchant |
| 6,225,649 | B1 | 5/2001 | Minato | 2003/0132450 A1 | 7/2003 | Minato et al. |
| 6,228,727 | B1 | 5/2001 | Lim et al. | 2003/0193067 A1 | 10/2003 | Kim |
| 6,239,463 | B1 | 5/2001 | Williams et al. | | | |

FOREIGN PATENT DOCUMENTS

| | | | |
|---|---|---|---|
| DE | 4300806 | C1 | 12/1993 |
| DE | 19736981 | A1 | 8/1998 |
| EP | 0975024 | A2 | 1/2000 |
| EP | 1026749 | A1 | 8/2000 |
| EP | 1054451 | A2 | 11/2000 |
| EP | 0747967 | B1 | 2/2002 |
| EP | 1205980 | A1 | 5/2002 |
| JP | 62-069562 | | 3/1987 |
| JP | 63-186475 | | 8/1988 |
| JP | 63-288047 | | 11/1988 |
| JP | 64-022051 | | 1/1989 |
| JP | 01-192174 | A | 8/1989 |
| JP | 05226638 | A | 9/1993 |
| JP | 2000-040822 | | 2/2000 |
| JP | 2000-040872 | | 2/2000 |
| JP | 2000-156978 | A | 6/2000 |
| JP | 2000-277726 | A | 10/2000 |
| JP | 2000-277728 | A | 10/2000 |
| JP | 2001-015448 | | 1/2001 |
| JP | 2001-015752 | | 1/2001 |
| JP | 2001-102577 | A | 4/2001 |
| JP | 2001-111041 | A | 4/2001 |
| JP | 2001-135819 | A | 5/2001 |
| JP | 2001-144292 | A | 5/2001 |
| JP | 2001-244461 | A | 9/2001 |
| JP | 2001-313391 | A | 12/2001 |
| JP | 2002-083976 | A | 3/2002 |
| WO | WO 00/33386 | A2 | 6/2000 |
| WO | WO 00/68997 | A1 | 11/2000 |
| WO | WO 00/68998 | A1 | 11/2000 |
| WO | WO 00/75965 | A2 | 12/2000 |

| | | | |
|---|---|---|---|
| 6,239,464 B1 | 5/2001 | Tsuchitani et al. | |
| 6,265,269 B1 | 7/2001 | Chen et al. | |
| 6,271,100 B1 | 8/2001 | Ballantine et al. | |
| 6,271,552 B1 | 8/2001 | D'Anna | |
| 6,271,562 B1 | 8/2001 | Deboy et al. | |
| 6,274,904 B1 | 8/2001 | Tihanyi | |
| 6,274,905 B1 | 8/2001 | Mo | |
| 6,277,706 B1 | 8/2001 | Ishikawa | |
| 6,281,547 B1 | 8/2001 | So et al. | |
| 6,285,060 B1 | 9/2001 | Korec et al. | |
| 6,291,298 B1 | 9/2001 | Williams et al. | |
| 6,291,856 B1 | 9/2001 | Miyasaka et al. | |
| 6,294,818 B1 | 9/2001 | Fujihira | |
| 6,297,534 B1 | 10/2001 | Kawaguchi et al. | |
| 6,303,969 B1 | 10/2001 | Tan | |
| 6,307,246 B1 | 10/2001 | Nitta et al. | |
| 6,309,920 B1 | 10/2001 | Laska et al. | |
| 6,313,482 B1 | 11/2001 | Baliga | |
| 6,316,806 B1 | 11/2001 | Mo | |
| 6,326,656 B1 | 12/2001 | Tihanyi | |
| 6,337,499 B1 | 1/2002 | Werner | |
| 6,346,464 B1 | 2/2002 | Takeda et al. | |
| 6,346,469 B1 | 2/2002 | Greer | |
| 6,351,018 B1 | 2/2002 | Sapp | |
| 6,353,252 B1 | 3/2002 | Yasuhara et al. | |
| 6,359,308 B1 | 3/2002 | Hijzen et al. | |
| 6,362,112 B1 | 3/2002 | Hamerski | |
| 6,362,505 B1 | 3/2002 | Tihanyi | |
| 6,365,462 B2 | 4/2002 | Baliga | |
| 6,365,930 B1 | 4/2002 | Schillaci et al. | |
| 6,368,920 B1 | 4/2002 | Beasom | |
| 6,368,921 B1 | 4/2002 | Hijzen et al. | |
| 6,376,314 B1 | 4/2002 | Jerred | |

| | | |
|---|---|---|
| WO | WO 01/06550 A1 | 1/2001 |
| WO | WO 01/06557 A1 | 1/2001 |
| WO | WO 01/45155 A1 | 6/2001 |
| WO | WO 01/59847 A2 | 8/2001 |
| WO | WO 01/71815 | 9/2001 |
| WO | WO 01/95385 A1 | 12/2001 |
| WO | WO 01/95398 A1 | 12/2001 |
| WO | WO 02/01644 A2 | 1/2002 |
| WO | WO 02/47171 A1 | 6/2002 |

OTHER PUBLICATIONS

Baliga "New Concepts in Power Rectifiers," Physics of Semiconductor Devices, Proceedings of the Third Int'l Workshop, Madras (India), Committee on Science and Technology in Developing Countries (1985), pp. 471-481.

Baliga "Options for CVD of Dielectrics Include Low-k Materials," Technical Literature from Semiconductor International, Jun. 1998, 4 pages total.

Baliga et al., "Improving the reverse recovery of power MOSFET integral diodes by electron irradiation," (Dec. 1983) *Solid State Electronics*, vol. 26, No. 12, pp. 1133-1141.

Brown et al. Novel Trench Gate Structure Developments Set the Benchmark for Next Generation Power MOSFET Switching Performance. Power Electronics—May 2003 Proceedings (PCIM), Nurenburg, vol. 47, pp. 275-278.

Bulucea "Trench DMOS Transistor Technology For High Current (100 A Range) Switching" Solid-State Electronics vol. 34 No. pp. 493-507 (1991).

Chang et al. "Numerical and experimental Analysis of 500-V Power DMOSFET with an Atomic-Lattice Layout," IEEE Transactions on Electron Devices 36:2623 (1989).

Chang et al. "Self-Aligned UMOSFET's with a Specific On-Resistance of $1m\Omega\,cm^2$," IEEE Transactions on Electron Devices 34:2329-2334 (1987).

Cheng et al., "Fast reverse recovery body diode in high-voltage VDMOSFET using cell-distributed schottky contacts," (May 2003) *IEEE Transactions on Electron Devices*, vol. 50, No. 5, pp. 1422-1425.

"CoolMOS™ the second generation," Infineon Technologies product information, (2000), 2 pages total.

Curtis, et al. "APCVD TEOS: 03 Advanced Trench Isolation Applications," Semiconductor Fabtech 9th Edition (1999) 8 pages total.

Darwish et al. A New Power W-Gated Trench MOSFET (WMOSFET) with High Switching Performance. ISPSD Proceedings—Apr. 2003, Cambridge, 4 pages total.

Djekic, O. et al., "High frequency synchronous buck converter for low voltage applications," (1998) *Proc. IEEE Power Electronics Specialist Conf.* (PESC), pp. 1248-1254.

Fujihira "Theory of Semiconductor Superjunction Devices" Jpn. J. Appl. Phys. vol. 36 pp. 6254-6262 (1997).

Gan et al. "Poly Flanked VDMOS (PFVDMOS): A Superior Technology for Superjunction Devices," IEEE Power Electronics Specialists Conference, Jun. 17-22, 2001, Vancouver, Canada (2001), 4 pages total.

Glenn et al. "A Novel Vertical Deep Trench RESURF DMOS (VTR-DMOS)" IEEE ISPD 2000, May 22-25, Toulouse France, pp. 197-200.

"IR develops CoolMOS™ -equivalent technology, positions it at the top of a 3-tiered line of new products for SMPS," International Rectifiers company Information available at http://www.irf.com (1999) 3 pages total. '.

Kao et al. "Two Dimensional Thermal Oxidation of Silicon-I. Experiments,", *IEEE Transactions on Electron Devices*, vol. ED-34,No. 5, May 1987, pp. 1008-1017.

Kao et al. "Two Dimensional Thermal Oxidation of Silicon-II. Modeling Stress Effects in Wet Oxides," *IEEE Transactions on Electron Devices*, vol. Ed-35, No. 1, Jan. 1988, pp. 25-37.

Kassakian, J.G. et al., "High-frequency high-density converters for distributed power supply systems," (Apr. 1988) *Proceedings of the IEEE*, vol. 76, No. 4, pp. 362-376.

Korman, C.S. et al., "High performance power DMOSFET with Integrated schottky diode," (1989) *Proc. IEEE Power Electronics Specialist Conf.* (*PESC*), pp. 176-179.

Lorenz at al., "COOL MOS- An important milestone towards a new power MOSFET generation" Power Conversion pp. 151-160 (1988).

Maksimovic, A.M. et al., "Modeling and simulation of power electronic converters," (Jun. 2001) *Proceedings of the IEEE*, vol. 89, No. 6, pp. 898-912.

Mehrotra, M. et al., "Very low forward drop JBS rectifiers fabricated using submicron technology," (Nov. 1993) *IEEE Transactions on Electron Devices*, vol. 40, No. 11, pp. 2131-2132.

Moghadam "Delivering Value Around New Industry Paradigms," Technical Literature from Applied Materials, pp. 1-11, vol. 1, Issue 2, Nov. 1999.

Park et al., "Lateral Trench Gate Super-Junction SOI-LDMOSFETs with Low On-Resistance," Institute for Microelectronics, University of Technology Vienna, Austria (2002), pp. 283-285.

Sakai et al., "Experimental investigation of dependence of electrical characteristics of device parameters in trench MOS barrier, schottky diodes," (1998) *International Symposium on Power Semiconductors and ICs, Technical Digest*, pp. 293-296.

Shenai et al., "Current transport mechanisms in atomically abrupt metal-semiconductor interfaces," (Apr. 1988) *IEEE Transactions on Electron Devices*, vol. 35, No. 4, pp. 468-482.

Shenai et al., "Monolithically integrated power MOSFET and schottky diode with improved reverse recovery characteristics," (Apr. 1990) *IEEE Transactions on Electron Devices*, vol. 37, No. 4, pp. 1167-1169.

Shenoy et al."Analysis of the Effect of Charge Imbalance on the Static and Dynamic Characteristic of the Super Junction MOSFET," IEEE International Symposium on Power Semiconductor Devices 1999, pp. 99-102 (1999).

Singer "Empty Spaces in Silicon (ESS): An Alternative to SOI," Semiconductor International p. 42, Dec. 1999.

Tabisz et al., "A MOSFET resonant synchronous rectifier for high-frequency dc/dc converters," (1990) *Proc. IEEE Power Electronics Specialist Conf.* (PESC), pp. 769-779.

Technical Literature from Quester Technology, Model APT-4300 300mm Atmospheric TEOS/Ozone CVD System, (unknown date), 3 pages total.

Technical Literature from Quester Technology, Model APT-6000 Atmospheric TEOS/Ozone CVD System, (unknown date), 2 pages total.

Technical Literature from Silicon Valley Group Thermal Systems, APNext, High Throughput APCVD Cluster Tool for 200 mm/300 mm Wafer Processing, (unknown date), 2 pages total.

Tu et al. "On the reverse blocking characteristics of schottky power diodes," (Dec. 1992) *IEEE Transactions on Electron Devices*. vol. 39, No. 12, pp. 2813-2814 2 pages total.

Ueda et al. "An Ultra-Low On-Resistance Power MOSFET Fabricated by Using a Fully Self-Aligned Process," IEEE Transactions on Electron Devices 34:926-930 (1987).

Wilamowski "Schottky Diodes with High Breakdown Voltages," Solid-State Electronics 26:491-493 (1983).

Wolf, "Silicon Processing for the VLSI Era" vol. 2 Process Integration Lattice Press (1990), 3 pages total.

Yamashita at al., 'Conduction Power loss in MOSFET synchronous rectifier with parallel-connected schottky barrier diode, (Jul. 1998) *IEEE Transactions on Power electronics*, vol. 13, No. 4, pp. 667-673.

* cited by examiner

METHOD OF FORMING A FET HAVING ULTRA-LOW ON-RESISTANCE AND LOW GATE CHARGE

CROSS-REFERENCES TO RELATED APPLICATIONS

This application is a continuation-in-part of U.S. application Ser. No. 10/754,276, filed Jan. 8, 2004, which is a divisional of U.S. application Ser. No. 09/640,955, filed Aug. 16, 2000, now U.S. Pat. No. 6,696,726, entitled "Vertical MOSFET with Ultra-low Resistance and Low Gate Charge", which disclosures are incorporated herein by reference in their entirety.

Two other related patents are U.S. Pat. No. 6,437,386, entitled "Method for Creating Thick Oxide on the Bottom Surface of a Trench Structure in Silicon" and U.S. Pat. No. 6,444,528, entitled "Selective Oxide Deposition in the Bottom of a Trench," both of which are assigned to the present assignee and are incorporated herein by reference for all purposes.

BACKGROUND OF THE INVENTION

The present invention relates to field effect transistors (FETs) and, in particular, to trench metal-oxide-semiconductor (MOS) transistors and methods of fabricating the same.

Power Metal-Oxide-Semiconductor Field Effect Transistors (MOSFETs) are well known in the semiconductor industry. One type of MOSFET is a double-diffused trench MOSFET, or what is known as a "trench DMOS" transistor. A cross-sectional view of a portion of a typical n-channel trench DMOS transistor 10 is shown in FIG. 1. It should be pointed out that the relative thickness of the various layers is not necessarily drawn to scale.

The trench DMOS transistor 10, shown in FIG. 1, includes an n-type substrate 100. An n-type epitaxial layer 102 is formed over substrate 100, and a p-type body region 108 is formed in epitaxial layer 102 through an implant/diffusion process. One or more trenches 109 extend through body region 108 and into region 102a of epitaxial layer 102. Gate oxide layer 104 lines the sidewalls and bottom of each trench 109 and a conductive material 106, typically doped polysilicon, lines gate oxide layer 104 and fills each trench 109. N+ source regions 110 flank each trench 109 and extend a predetermined distance into body region 108. Heavy body regions 112 are positioned within body region 108, between source regions 110, and extend a predetermined distance into body region 108. During the high temperature cycles of the process (e.g., the anneal steps for activating the dopants in body region 108, source regions 110, and heavily doped body regions 112) the n-type dopants in substrate 100 tend to diffuse into epitaxial layer 102 thus forming the substrate out-diffusion region 101. Finally, dielectric caps 114 cover the filled trenches 109 and also partially cover source regions 110. Note that trench DMOS transistor 10 also typically includes one or more metal layers, which contact source regions 110, with adjacent metal layers separated by an insulating material. These metal layers are not shown in FIG. 1.

FIG. 2 shows a doping concentration profile, taken along a cross-section labeled "xx" in FIG. 1. Cross section xx is representative of the resistance path 116 that a drain-to-source current, $I_{DS}$, encounters as charge carriers travel from source region 110 to the drain of trench DMOS transistor 10, when trench DMOS transistor is on. The various regions that comprise path 116 are source region 110, body region 108, portion 102a of epitaxial layer 102, substrate out-diffusion region 101 and substrate 100.

The resistance encountered by $I_{DS}$ due to the presence of these various regions is typically quantified as the drain-to-source resistance, $R_{DS}(on)$. A high $R_{DS}(on)$ limits certain performance characteristics of the transistor. For example, both the transconductance, $g_m$, of the device, which is a measure of the current carrying capability of the device (given a certain gate voltage) and the frequency response of the device, which characterizes the speed of the device, are reduced for higher $R_{DS}(on)$. Another factor that limits the speed of the trench DMOS transistor is the gate oxide charge, $Q_g$. The higher $Q_g$ is the larger the gate-to-drain overlap capacitance becomes and, consequently, the lower the switching capability of the device becomes.

Because the drain-source voltage is dropped almost entirely across the channel region, which comprises the body and epitaxial layers, the channel length, channel resistance and channel concentration profile are critical characteristics that affect the operating performance of a trench MOSFET. Whereas the absolute values of these characteristics are important, so too is the controllability of their variation. Wide device-to-device variations negatively affect the reproducibility of a device having desired performance capabilities.

BRIEF SUMMARY OF THE INVENTION

In accordance with the present invention, a trench DMOS transistor is characterized by an ultra-low on resistance $R_{DS}(on)$ and a low gate charge. The structure and method of manufacturing the DMOS transistor minimizes variations in the transistor characteristics by controlling substrate out-diffusion.

In accordance with an embodiment of the invention, a field effect transistor is manufactured as follows. A substrate cap region of a first conductivity type silicon is formed such that the substrate cap region forms a junction with a substrate of the first conductivity type silicon. A body region of a second conductivity type silicon is formed such that the body region forms a junction with the substrate cap region. A trench extending through at least the body region is formed. A source region of the first conductivity type is formed in the body region, wherein during one or more temperature cycles, dopants of the first conductivity type out-diffuse into a lower portion of the body region to form an out-diffusion region of the first conductivity type in the lower portion of the body region such that a spacing between the source region and the substrate out-diffusion region defines a length of a channel region of the field effect transistor.

In one embodiment, the trench further extends through the out-diffusion region and the substrate cap region, and the conductive material extends through a substantial depth of the out-diffusion region.

In another embodiment, the dielectric material is thicker along the bottom of the trench than along its sidewalls.

In another embodiment, the out-diffusion region extends from an interface between the body region and the substrate cap region into the body region.

In another embodiment, during the one or more temperature cycles the substrate cap region influences said out-diffusion of the dopants of the first conductivity type into the body region such that the length of the channel region varies less and thus is substantially predictable.

In one embodiment, the substrate cap region has a thickness of less than or equal to two micrometers.

In accordance with another embodiment of the invention, a field effect transistor includes a substrate of a first conductivity type silicon. A substrate cap region of the first conductivity type silicon forms a junction with the substrate. A body region of a second conductivity type silicon forms a junction with the substrate cap region. A trench extends at least through the body region. A source region of the first conductivity type is in an upper portion of the body region. An out-diffusion region of the first conductivity type is in a lower portion of the body region such that a spacing between the source region and the out-diffusion region defines a channel length of the field effect transistor.

In one embodiment, the out-diffusion region extends from an interface between the body region and the substrate cap region into the body region.

In another embodiment, the substrate cap region and the body region are epitaxial layers.

In another embodiment, the substrate cap region has a thickness of less than or equal to two micrometers.

A further understanding of the nature and advantages of the invention may be realized by reference to the remaining portions of the specification and the attached drawings.

DETAILED DESCRIPTION OF THE INVENTION

The present invention is directed to a trench MOSFET device, and its method of manufacture, that can be used in applications such as cellular phone power supplies and battery switching. The trench MOSFET of the present invention is defined by a structure having a low drain-to-source resistance, low gate charge and a method of fabrication that minimizes device-to-device variations in operating characteristics by controlling out-diffusion from the transistor substrate.

Figure 3:
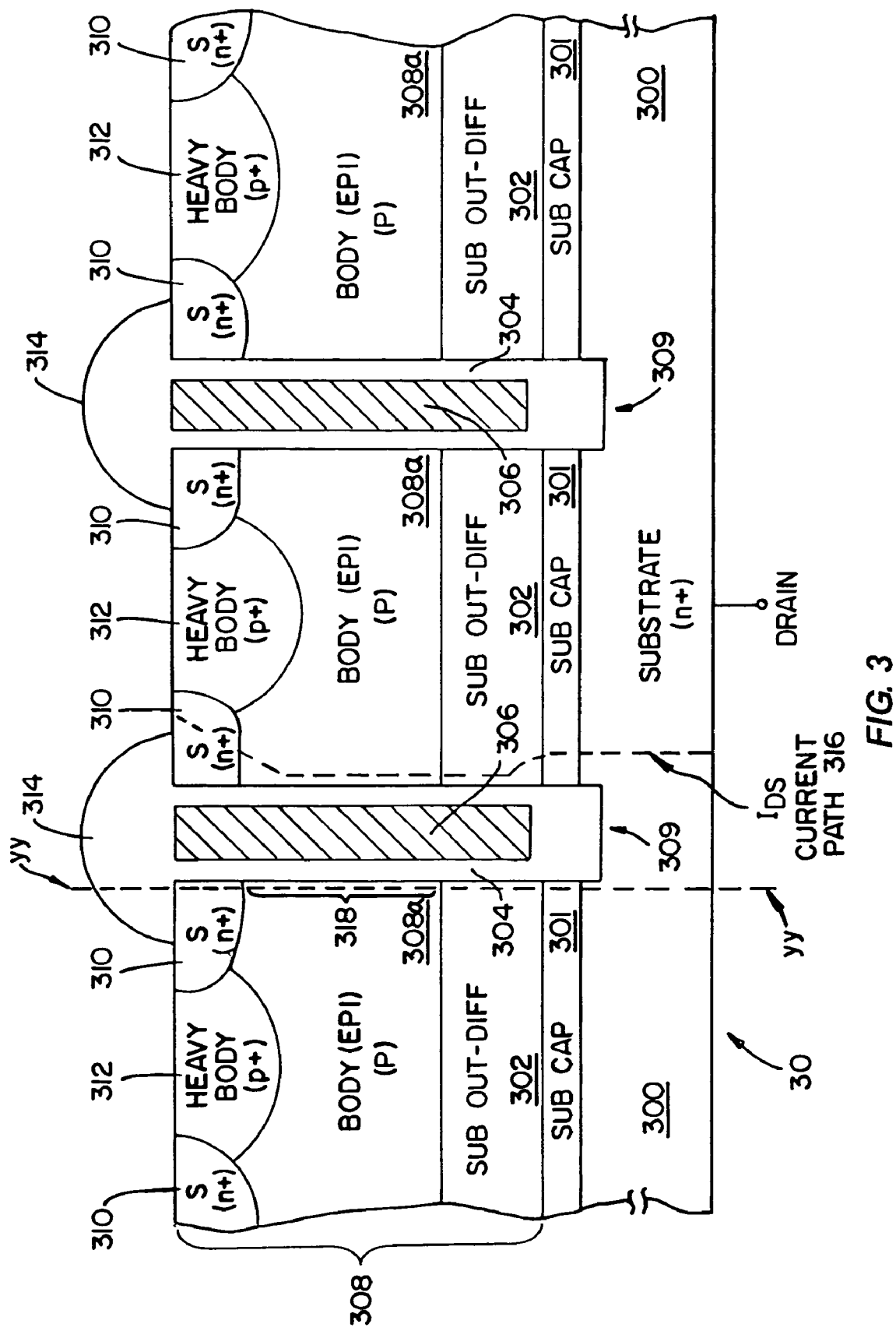
FIG. 3 shows a cross-sectional view of an exemplary n-channel trench DMOS transistor 30 according to one embodiment of the present invention.

FIG. 3 shows a cross-sectional illustration of an exemplary n-channel trench DMOS transistor 30 according to one embodiment of the present invention. Trench DMOS transistor 30 includes an n-type substrate 300, which has a resistivity of, for example, 1-5 mΩ-cm, over which a substrate cap region 301 is formed. Substrate cap region 301 is heavily doped and has a resistivity of, for example, 1 mΩ-cm. Substrate cap region 301 functions to provide a more constant resistivity range than what substrate vendors typically guarantee. For example, substrate vendors typically guarantee that the resistivity of an Arsenic n-type substrate be only somewhere within the range of 1-5 mΩ-cm. As explained below, the more precisely controlled resistivity of substrate cap region 301, relative to substrate resistivities, ensures a more predictable and stable channel length.

A p-type body region 308 is epitaxially formed over substrate cap region 301. The thickness and resistivity of p-type body region 308 are, for example, 4 μm and 0.1 Ω-cm, respectively. One or more trenches 309 extend through body region 308, substrate cap region 301 and, preferably, a portion of substrate 300. Gate oxide layer 304 lines the sidewalls and bottom of each trench 309 and a conductive material 306, for example, doped polysilicon, lines gate oxide layer 304 and fills each trench 309. The thickness of gate oxide layer 304 is preferably thicker at the bottom of each trench 309 than on the sidewalls of the trench 309.

N+ source regions 310 flank each trench 309 and extend a predetermined distance into body region 308. Heavy body regions 312 are positioned within body region 308, between source regions 310, and extend a predetermined distance into body region 308. Dielectric caps 314 cover the filled trenches 309 and also partially cover source regions 310.

An n-type substrate out-diffusion region 302 extends up from the interface between body region 308 and substrate cap region 301 into body region 308. Substrate out diffusion region 302 is formed as a result of n-type dopants in substrate cap region 301 out-diffusing into body region 308 during high temperature cycles such as the oxide layer formation and anneals to activate the dopants in source regions 310 and heavily doped body regions 312.

Because the resistivity of cap layer 301 varies far less than that of substrate 300, the extent to which substrate out-diffusion region 302 extends into body 308 can be predicted more accurately. Since channel length 318 of DMOS 30 is defined by the spacing between source 310 and substrate out-diffusion 302, the improved predictability and controllability of the out-diffusion of region 302 enables tighter control over and the reduction of channel length 308. Better control of channel length 308 leads to a more predictable and reproducible $R_{DS}(on)$, $Q_g$ and breakdown voltage.

Trench DMOS transistor 30 also includes one or more metal layers, which contact source regions 310, with adjacent metal layers separated by an insulating material. These metal layers are not shown in FIG. 3.

Figure 1:
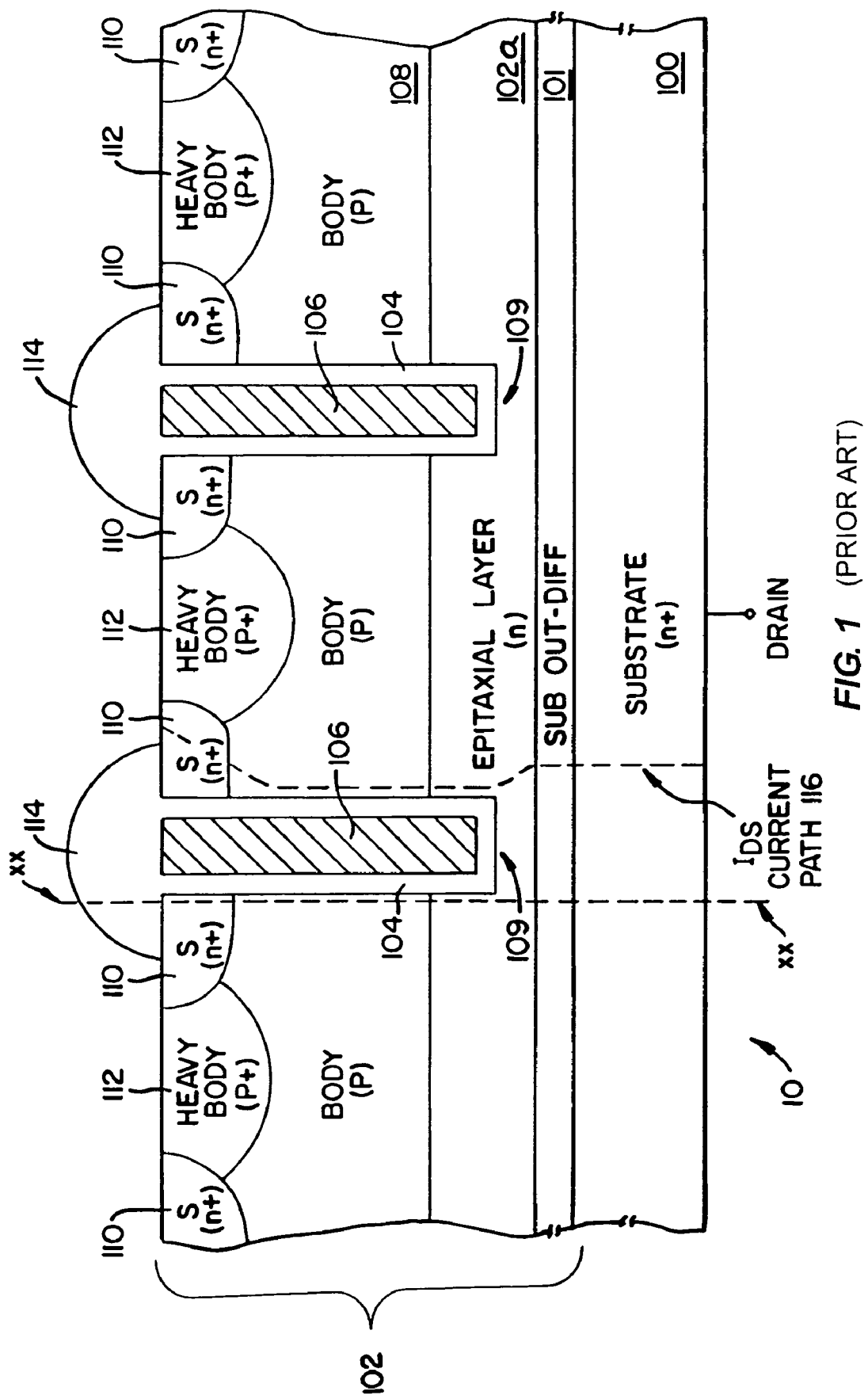
FIG. 1 shows a cross-sectional view of a conventional trench DMOS transistor.

Comparing trench DMOS transistor 30 to trench DMOS transistor 10 in FIG. 1 reveals some important distinctions. First, as was described above, it is preferred that the thickness of gate oxide layer 304 be larger at the bottoms of each trench 309 than on the sidewalls of each trench 309. The reason for this is that a thicker gate oxide at the bottom of trenches 309 alleviates high electric fields in the vicinity of the bottom of trenches 309, thereby providing a higher breakdown voltage, BVdss. The relatively greater thickness also has the effect of reducing the gate-drain overlap capacitance, so that the gate charge, $Q_g$, is reduced.

Second, trench DMOS transistor 30 does not incorporate an n-type epitaxial layer as trench DMOS transistor 10 does (see, layer 102 in FIG. 1). The primary purpose of the n-type epitaxial layer is to provide a region for depletion to avoid reach through. However, while not necessarily limited to, the trench DMOS transistor of the present invention is envisioned to be mainly for low voltage applications. A benefit of the absence of any n-type epitaxial layer in trench DMOS transistor 30 is that a reduced current path is realized so that $R_{DS}(on)$ is lowered. As explained above, a lower $R_{DS}(on)$ improves certain performance capabilities of the device, which are characterized by, for example, a higher transconductance, $g_m$, and an improved frequency response.

Finally, body region 308 is formed by epitaxial deposition, as compared to an implant/diffusion process used in forming body region 108 in the trench DMOS transistor shown in FIG. 1. The diffusion step in the manufacture of a trench DMOS is typically performed at high temperature and operates to drive all junctions, including substrate out-diffusion region 101 in trench DMOS transistor 10 shown in FIG. 1. A typical diffusion cycle used in the manufacture of trench DMOS transistor 10 of FIG. 1 can result in a substrate out-diffusion region thickness of over 2 µm. Because a diffusion cycle is not required for forming body region 308 of trench DMOS transistor 30, the thickness of substrate out-diffusion region 302 can be made much thinner, for example, less than or equal to 1 µm. Moreover, for a given channel length, channel 318 can hold more charge than that of a conventional trench DMOS transistor having a body region formed using an implant/diffusion process. Because channel 318 of trench DMOS transistor 30 can hold more charge, it is less likely that drain-to-source punch-through will occur. Hence, channel length 318 of trench DMOS 30 can be reduced. The reduction in channel length 318 and the thickness of substrate out-diffusion region 302 result in lower $R_{DS}$(on).

Figure 2:
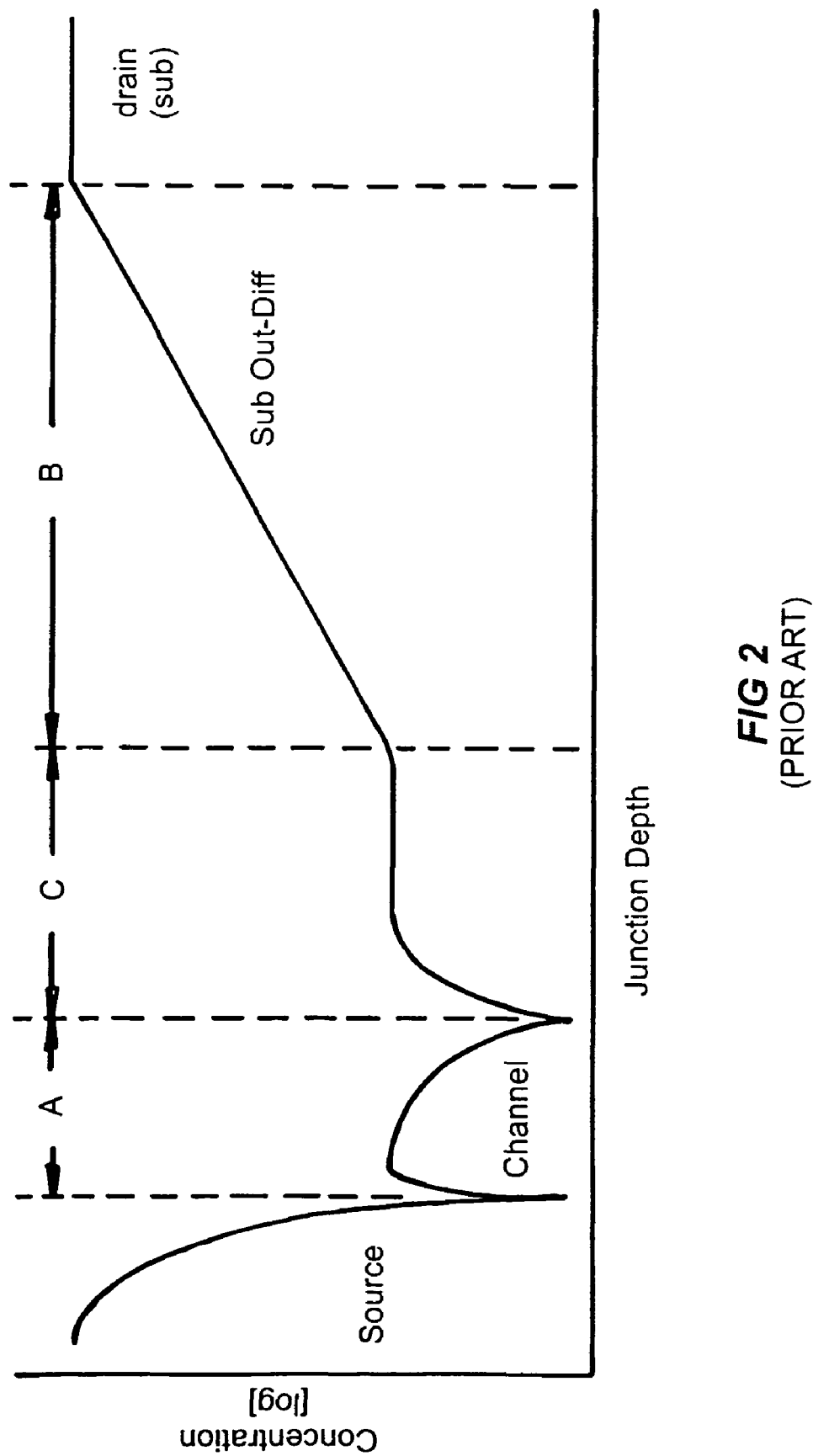
FIG. 2 shows a doping concentration profile along a cross-section "xx" of the trench DMOS transistor shown in FIG. 1.
Figure 4:
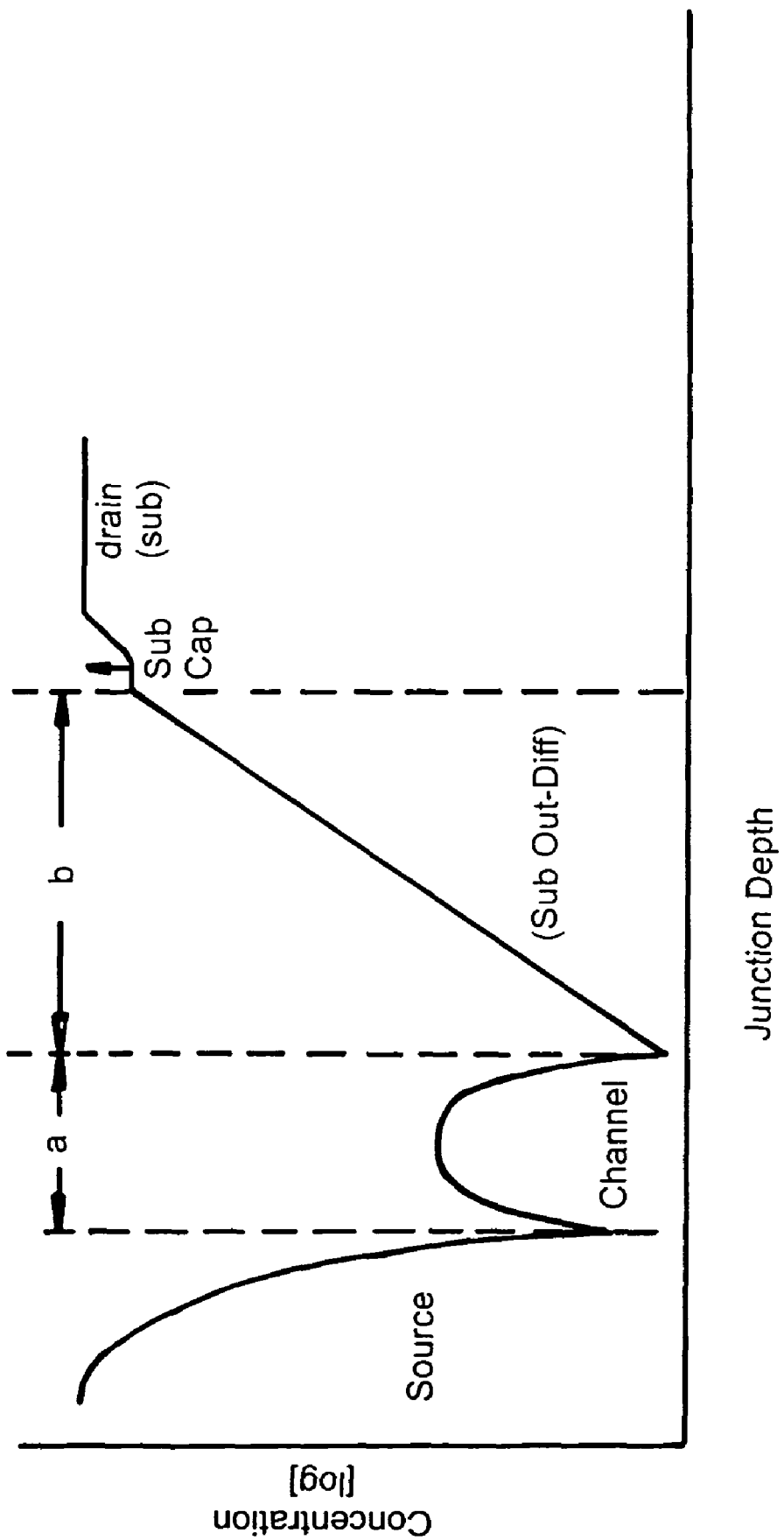
FIG. 4 shows an exemplary doping concentration profile, taken along a cross-section "yy" of the trench DMOS transistor shown in FIG. 3.

Referring now to FIG. 4, there is shown an exemplary doping concentration profile taken along a cross-section labeled "yy" for trench DMOS transistor 30 shown in FIG. 3. Comparing this doping profile to the doping profile in FIG. 2 of the conventional trench DMOS transistor 10 in FIG. 1, shows that (1) no n-type epitaxial layer is used in the trench DMOS transistor 30 of the present invention; (2) channel length 318 of DMOS transistor 30 of the present invention is shorter; and (3) substrate out-diffusion region 302 of DMOS transistor 30 is thinner and has a steeper concentration gradient than that of conventional DMOS transistor 10. All of these characteristics have the effect of reducing the overall drain to source current path, thereby making $R_{DS}$(on) smaller.

Figure 5:
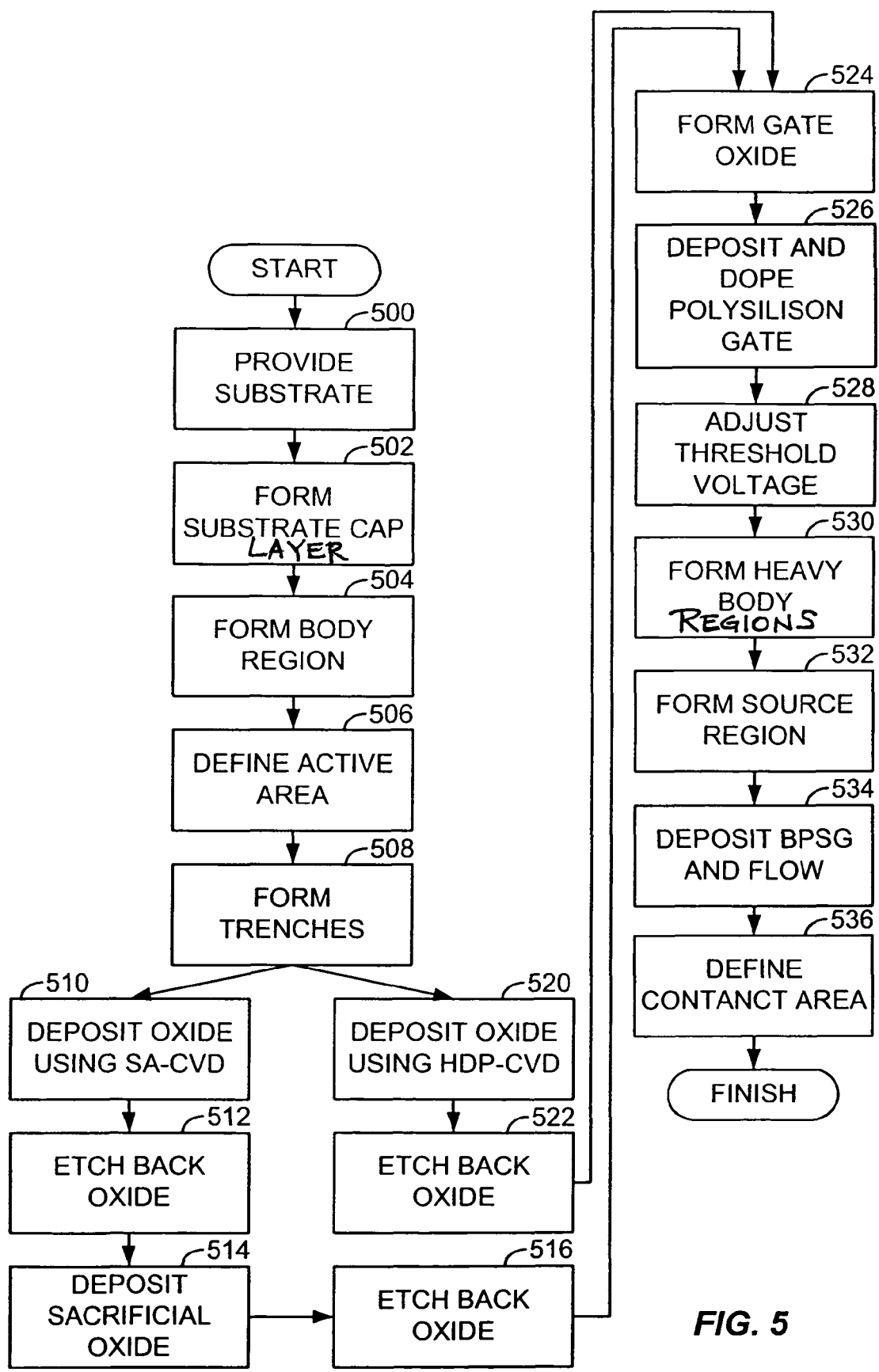
FIG. 5 shows an exemplary process flow, according to another aspect of the invention, for fabricating the trench DMOS transistor shown in FIG. 3.

Referring now to FIG. 5, there is shown an exemplary process flow, according to another aspect of the invention, for fabricating a trench DMOS transistor. This process flow can be used, for example, to fabricate the trench DMOS transistor shown in FIG. 3. The process flow shown in FIG. 5 will now be described in reference to FIGS. 6A through 6J.

Figure 6A:
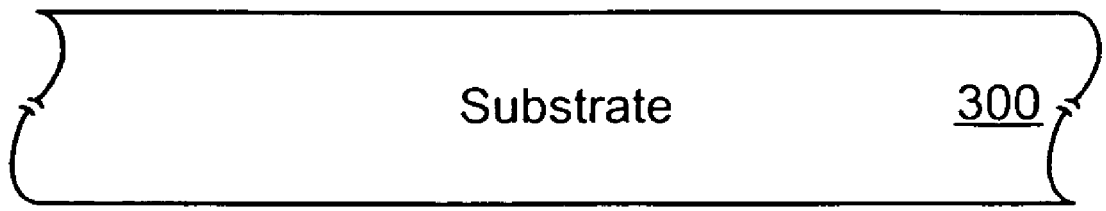
FIGS. 6A-6J show cross-sectional views of the formation of the trench DMOS transistor according to the process flow shown in FIG. 5.
Figure 6B:
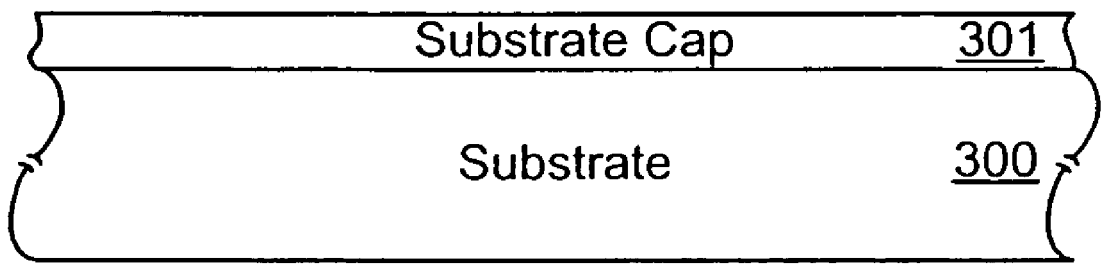

Initially, a substrate 300, having a resistivity of, for example 1 to 5 mΩ-cm is provided in step 500. This is shown in FIG. 6A. Next, in step 502, a substrate cap region 301 is epitaxially formed over substrate 300. Substrate cap region 301 has a resistivity of, for example less than or approximately equal to 1 mΩ-cm and a thickness less than or equal to 2 µm. In one embodiment, substrate cap region 301 has a thickness of approximately 1 µm. The structure corresponding to step 502 is shown in FIG. 6B.

Figure 6C:
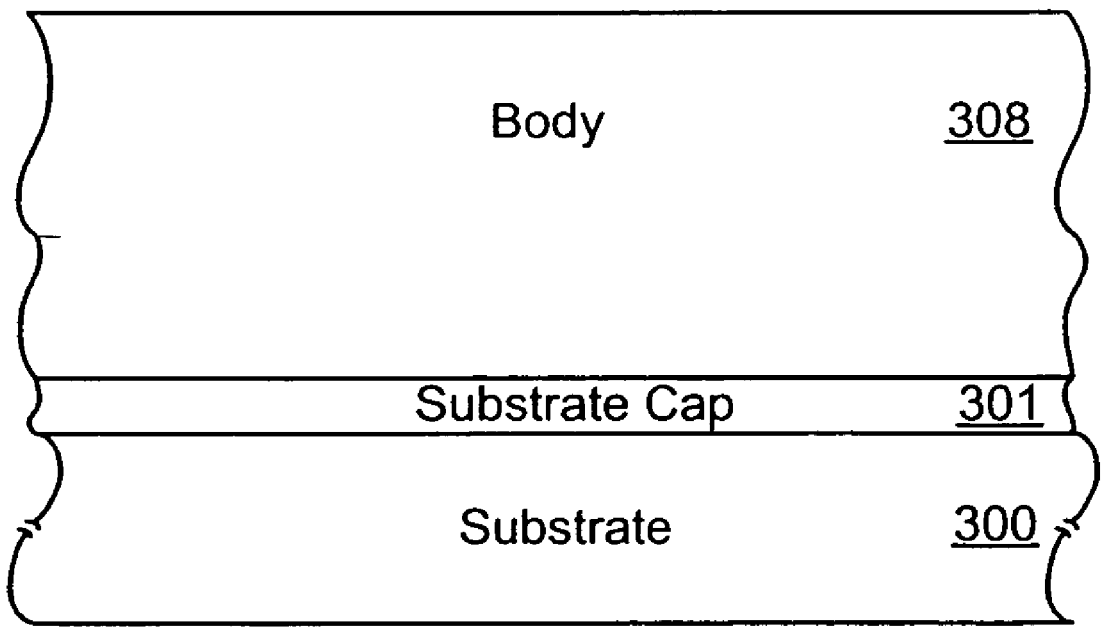

In step 504, a p-type body region 308 is epitaxially formed over substrate cap region 301. In one embodiment, body region 308 has a depth of approximately 4 µm, and a resistivity of about 0.1 mΩ-cm. The structure corresponding to step 504 is shown in FIG. 6C. Next, in step 506, an initial oxide layer is formed over the p-type body region 308, over which an active area of transistor 30 is defined using conventional photolithography techniques.

Figure 6D:
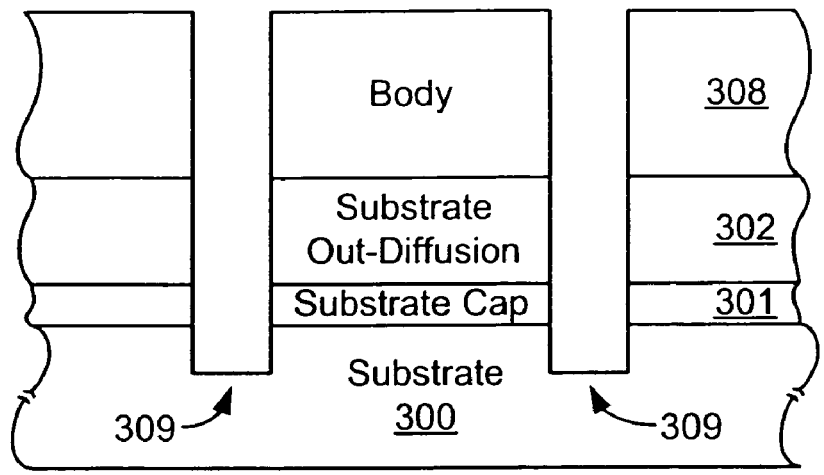

After the active area has been defined, trenches 309 are formed in step 508. This step is shown in FIG. 6D. An anisotropic etch may be used to create trenches 309. The anisotropic etch is in the form of a plasma, which is an almost neutral mixture of energetic molecules, ions and electrons that have been excited in a radio-frequency electric field. Different gases are used depending on the material to be etched. The principal consideration is that the reaction products must be volatile. For etching silicon, the reactants may be, for example, $He:O_2$, $NF_3$ and HBr the pressure may be, for example, 140 mTorr and the duration of the etch may be approximately 3 minutes. In this example, the trenches have a depth of approximately 2.5 µm. As shown in FIG. 6D, each trench 309 extends vertically downward from an exposed surface of body region 308, into and through body region 308, through substrate out-diffusion layer 302, through substrate cap region 301 and partially into substrate 300.

Figure 6E:
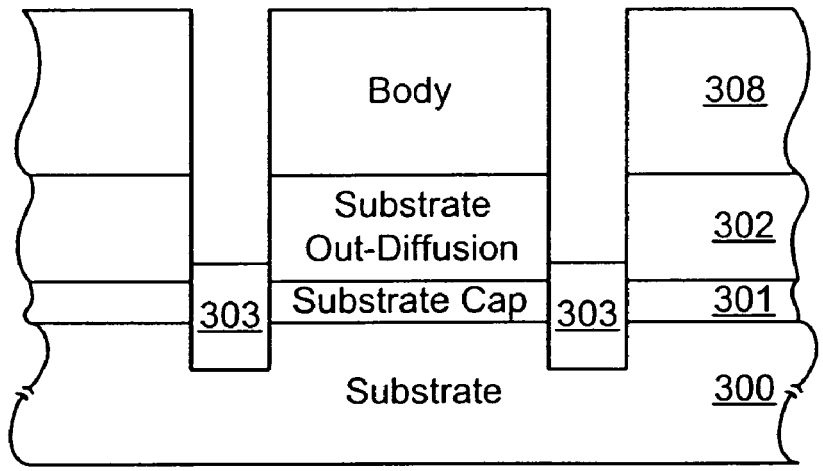

Next, an oxide plug 303 is formed at the bottom of each trench 309 as shown in FIG. 6E. These oxide plugs 303 can be formed in a variety of ways. Two embodiments are shown in FIG. 5 by steps 510-516 and steps 520-522. In the embodiment of steps 510-516, in step 510, sub-atmospheric chemical vapor deposition (SA-CVD) is used to deposit oxide on the sidewalls, bottom and over the upper and lower corners of each trench 309. Then, in step 512, the oxide is etched back so that only an oxide plug 303 remains at the bottom of each trench 309. A sacrificial oxide, having a thickness of about 500 Å may then be deposited (step 514) and then stripped (step 516) to prepare the trench sidewalls for a gate oxide. The sacrificial oxide and strip steps are optional.

Oxide plug 303 can be alternatively formed using a process known as high-density plasma chemical vapor deposition (HDP-CVD) as shown by the embodiment of steps 520-522. In step 520, oxide is deposited on the sidewalls, bottom and over the upper and lower corners of each trench 309. Then, in step 522, the oxide is etched back using a wet etch to leave an oxide plug 303 at the bottom of each trench 309.

Figure 6F:
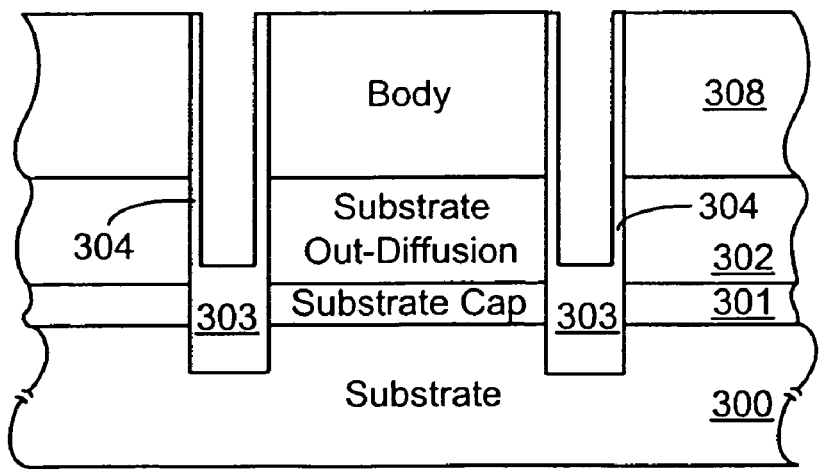
Figure 6G:
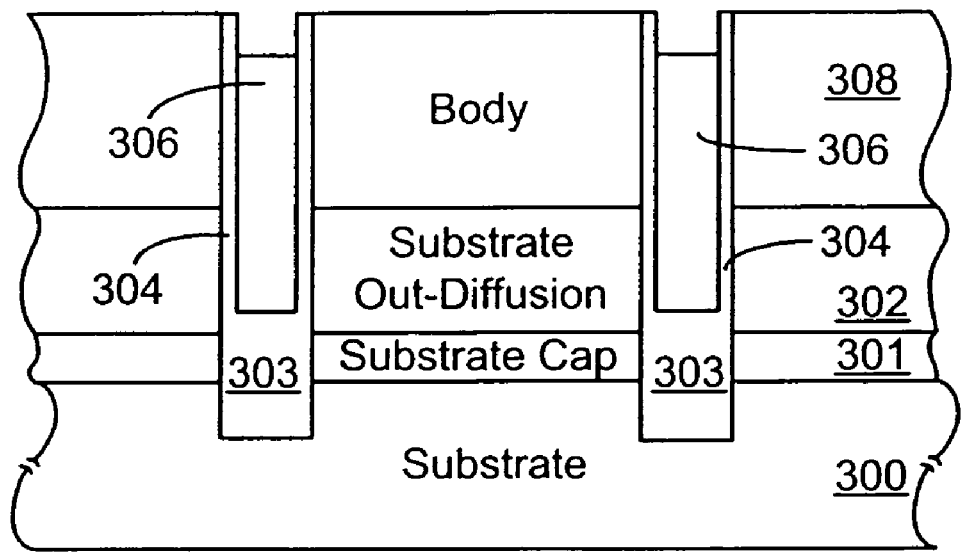

Next, in step 524, a gate oxide 304 is formed on the sidewalls of trenches 309 as shown in FIG. 6F. The thickness of gate oxide 304 in this example, is about 200 Å. Next, in step 526, trenches 309 are lined and at least partially filled with polysilicon 306 and then doped using, for example, an n-type implant or by administering a conventional $POCL_3$ doping process. Doping can also be performed using an in-situ process, i.e., as the polysilicon is deposited. The structure corresponding to step 528 is shown in FIG. 6G. Next, in optional step 528, the threshold voltage of the structure can be adjusted by administering a p-type implant having, for example, an energy and dose of 70 keV and $3\times10^{13}/cm^2$, respectively.

Figure 6H:
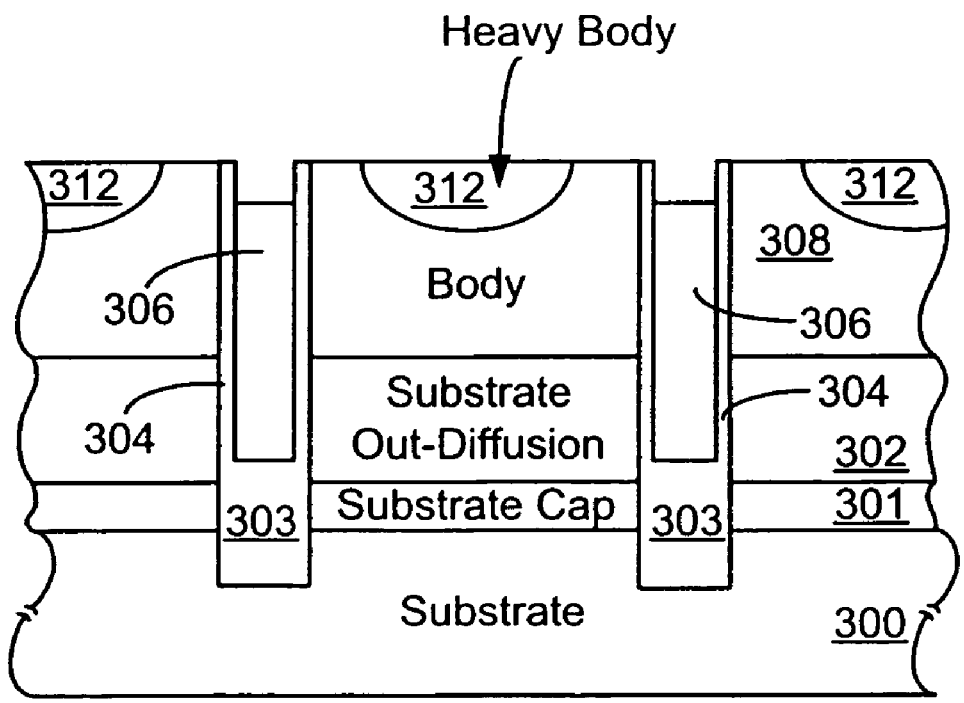

Next, in another optional step 530, p+ heavy body regions 312 can be formed between adjacent trenches 309 as shown in FIG. 6H. This is accomplished by defining the surface areas through which heavy body regions 312 are to be formed using, for example, conventional photolithography. Through the defined surface areas, two separate p-type (e.g., boron) implants are performed, although in some applications a single implant may be sufficient. In this example, a first implant is performed at a dose and energy of, for example, $2\times10^{15}/cm^2$ and 135 keV, respectively and a second implant is performed at a dose and energy of $5\times10^{14}/cm^2$ and 70 keV, respectively. The primary purpose of the first implant is to bring the depth of heavy body regions 312 as deep as is necessary to compensate for the n+ source regions which are formed later in the process. The second implant has a low energy but a high dose. The purpose of this implant is to extend high concentration of the p+ heavy body from the first implant to the surface so that an ohmic contact can be formed. The dose is made high enough to accomplish this but not so high as to overcompensate the n+ source region. In an alternative embodiment, heavy body region 312 can be formed following a contact defining step (step 536), which is performed later in the process.

Figure 6I:
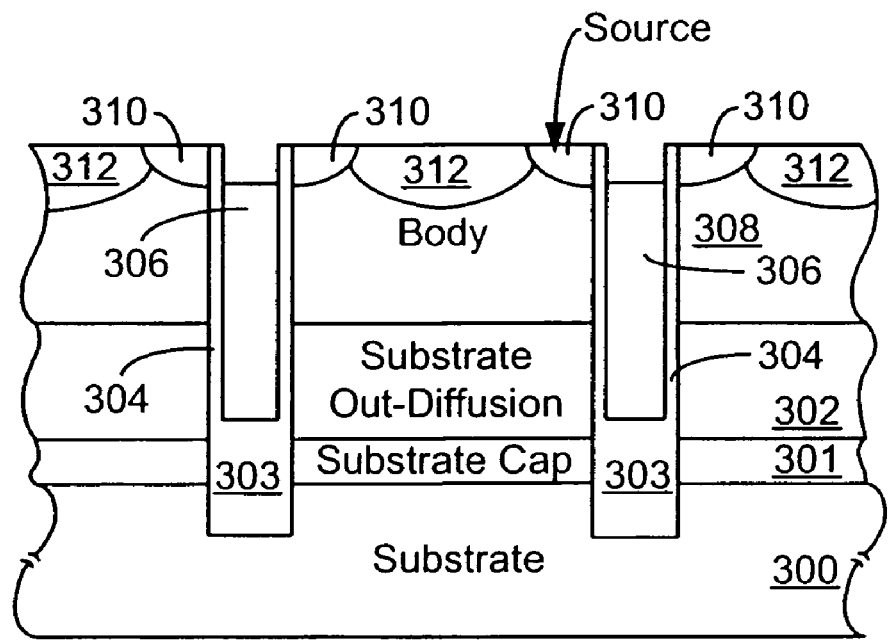

In step 532 source regions 310 are formed as shown in FIG. 6I. Similar to formation of heavy body region 312, in this example a double implant may be used. In this example, surface areas through which source regions 310 are to be formed are defined using, for example, conventional photolithography. Through these surface areas, two separate n-type implants are performed, although in some applications a single implant may be sufficient. In this example, a first implant of arsenic is performed at a dose and energy of, for example, $8 \times 10^{15}$ cm² and 80 keV, respectively and a second implant of phosphorous is performed at a dose and energy of $5 \times 10^{15}$/cm² and 60 keV, respectively. The purpose of the first implant is to form source regions 310 and the purpose of the second implant is to extend source regions 310 to the surface so that a source contact can be formed.

Whereas the above description described formation of heavy body regions 312 prior to the formation of source regions 310, in an alternative embodiment heavy body regions 312 could be formed following formation of source regions 310.

Next, in step 534, an insulating layer, e.g., borophosphosilicate glass, having a thickness in the range of about 5 to 15 kÅ is deposited over the exposed surface of the entire structure. Then the insulating layer is densified or "flowed".

Figure 6J:
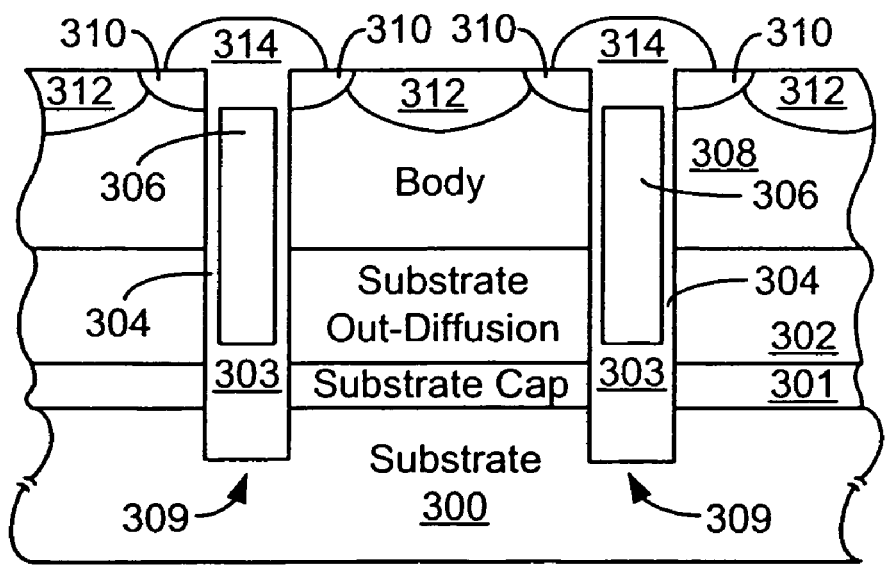

In step 536, the insulating layer is patterned and etched using, for example, standard photolithography, to define electrical contact areas for the trench DMOS structure. As shown in FIG. 6J, the dielectric etch is controlled to preserve insulating caps 314 over trenches 309. After step 536, metallization and passivation steps are performed, although they are not shown in the process diagramed in FIGS. 5 and 6. One skilled in the art would understand, however, what is necessary to perform these steps.

In the above process flow, the temperature cycles associated with formation of dielectric layers (steps 506 and 524) results in the out-diffusion of the n-type dopants from substrate cap region 301 into body region 308, thus forming substrate out-diffusion region 302 in body region 308 as shown in FIGS. 6D through 6F. A further out-diffusion of dopants into body region 308 occurs during the temperature cycles associated with formation of heavy body regions 312 (step 530) and source regions 310 (step 532). The thickness and doping concentration/gradient of substrate out-diffusion region 302 are primarily determined by the characteristics of substrate cap region 301 (e.g., its doping concentration and thickness), and the total process DT (the product of diffusion coefficient and time). Therefore, to minimize the extent of out-diffusion of region 302 into body region 308, RTP (rapid thermal processing) can be used everywhere possible in the process flow to minimize the overall DT.

Although the invention has been described in terms of specific processes and structures, it will be obvious to those skilled in the art that many modifications and alterations may be made to the disclosed embodiment without departing from the invention. For example, an alternative to epitaxially forming substrate cap region 301 is to form substrate cap region 301 within substrate 300 by implanting dopants and driving the dopants into substrate 300. As another example, an alternative to epitaxially forming body region 308*a* is to initially form an n-type epitaxial layer over substrate cap region 301 followed by implanting p-type dopants and driving the dopants into the n-type epitaxial layer such that the body region is formed within the epitaxial layer. This particular variation is advantageous in that: (i) it allows integration of the transistor cell structure of the invention with a wider variety of termination structures, and (ii) a body region formed by diffusion (as opposed to an epitaxially formed body region) leads to less variations in threshold voltage. As yet another example, a p-channel trench DMOS may be formed by using silicon layers with complementary conductivity types relative to those of the trench DMOS structure shown in FIG. 3. Also, all of the values provided such as for dimensions, temperatures, and doping concentrations, are for illustrative purposes only and may be varied to refine and/or enhance particular performance characteristics of the trench DMOS transistor. Hence, these modifications and alterations are intended to be within the spirit and scope of the invention as defined by the appended claims.

What is claimed is:

1. A method of forming a field effect transistor, comprising:
    epitaxially forming a substrate cap region of a first conductivity type silicon over and in contact with a substrate of the first conductivity type silicon;
    epitaxially forming a body region of a second conductivity type silicon over and in contact with the substrate cap region;
    forming a plurality of trenches each extending at least through the body region;
    lining the sidewalls and bottom of each trench with a dielectric material;
    at least partially filling each trench with a conductive material; and
    forming a plurality of source regions of the first conductivity type in an upper portion of the body region,
    wherein during one or more temperature cycles, dopants of the first conductivity type in the substrate cap region out-diffuse into a lower portion of the body region to form an out-diffusion region of the first conductivity type extending from an interface between the body region and the substrate cap region into the body region such that a spacing between the source regions and the out-diffusion region defines a length of a channel region of the field effect transistor.

2. The method of claim 1 wherein:
    each trench extends through the out-diffusion region, and
    the conductive material in each trench extends through a substantial depth of the out-diffusion region.

3. The method of claim 1 wherein during the one or more temperature cycles the substrate cap region influences said out-diffusion of the dopants of the first conductivity type into the body region such that the length of the channel region varies less and is thus substantially predictable.

4. The method of claim 1 wherein the substrate cap region has a thickness less than or equal to 2 μm.

5. The method of claim 1 wherein the out-diffusion region has a graded doping concentration decreasing in a direction away from an interface between the out-diffusion region and the substrate cap region.

6. A method of forming a field effect transistor, comprising:
    providing a substrate of a first conductivity type silicon;
    forming a substrate cap region of the first conductivity type silicon such that a junction is formed between the substrate cap region and the substrate;
    forming an epitaxial layer of the first conductivity type silicon over the substrate cap region;
    implanting dopants of a second conductivity type into the epitaxial layer and driving the dopants into the epitaxial layer to thereby form a body region having a junction with the substrate cap region;
    forming a plurality of trenches each extending at least through the body region;
    lining the sidewalls and bottom of each trench with a dielectric material;
    at least partially filling each trench with a conductive material; and
    forming a plurality of source regions of the first conductivity type in an upper portion of the body region,
    wherein during one or more temperature cycles, dopants of the first conductivity type in the substrate cap region out-diffuse into a lower portion of the body region to form an out-diffusion region of the first conductivity type extending from the junction between the body region and the substrate cap region into the body region such that a spacing between the source regions and the out-diffusion region defines a length of a channel region of the field effect transistor.

7. The method of claim 6 wherein the substrate cap region is epitaxially formed over and in contact with the substrate.

8. The method of claim 6 wherein the substrate cap region is formed in the substrate by implanting dopants of the first conductivity type into the substrate.

9. A field effect transistor, comprising:
a substrate of a first conductivity type silicon;
an epitaxial substrate cap region of the first conductivity type silicon over and in contact with the substrate;
an epitaxial body region of a second conductivity type over and in contact with the substrate cap region;
a plurality of trenches each extending at least through the body region;
a dielectric material lining the sidewalls and bottom of each trench;
a conductive material at least partially filling each trench;
a plurality of source regions of the first conductivity type in an upper portion of the body region; and
an out-diffusion region of the first conductivity type extending from an interface between the body region and the substrate cap region into the body region such that a spacing between each source region and the out-diffusion region defines a length of a channel region of the field effect transistor, the channel region extending vertically along a sidewall of each trench.

10. The field effect transistor of claim 9 wherein:
each trench extends through the out-diffusion region, and
the conductive material in each trench extends through a substantial depth of the out-diffusion region.

11. The field effect transistor of claim 9 wherein the dielectric material in each trench is thicker along the bottom of each trench than along the sidewalls of each trench.

12. The field effect transistor of claim 9 wherein the out-diffusion region has a graded doping concentration decreasing in a direction away from an interface between the out-diffusion region and the substrate cap region.

13. The field effect transistor of claim 9 wherein the substrate cap region has a thickness of less than or equal to two micrometers.

* * * * *